Dec. 27, 1955

G. C. SZIKLAI 2,728,857

ELECTRONIC SWITCHING

Filed Sept. 9, 1952

INVENTOR.
George C. Sziklai
BY [signature]
ATTORNEY

United States Patent Office 2,728,857

Patented Dec. 27, 1955

2,728,857

ELECTRONIC SWITCHING

George C. Sziklai, Princeton, N. J., assignor to Radio Corporation of America, a corporation of Delaware Application September 9, 1952, Serial No. 308,618

24 Claims. (Cl. 250—36)

This invention relates to electrical circuit arrangements utilizing semi-conductor circuit elements, and more particularly to circuit arrangements employing transistors of the so-called junction type as switching devices permissive of bidirectional current flow.

It has been well recognized that switching actions may be achieved electronically through the use of vacuum tubes or gas tubes as switching devices. However, there has been one inherent limitation to all heretofore described electronic switching circuits: the inability of any single electronic switching device to support bidirectional current flow, the inability stemming from the essentially unidirectional nature of the known switching devices. The present invention therefore constitutes an innovation in the electronic switching art by providing fast switching circuits with truly bidirectional electronic switching devices which rely upon unique characteristics of the junction transistor.

The practitioner of the present invention who should desire a theoretical background on junction transistors in general may refer to the following publications and patent for a preliminary knowledge of the nature of the junction transistor, some of its better known characteristics, and projected theories of its operation: "The theory of p-n junctions in semiconductors and p-n junction transistors" by W. Shockley, appearing in volume 28 (1949) of the Bell System Technical Journal, starting at page 435; "Electrons and Holes in Semiconductors" by W. Shockley, published by D. Van Nostrand Co. in 1950; "P-n junction transistors" by W. Shockley, N. Sparks, and G. K. Teal, appearing in volume 83 of The Physical Review, starting at page 151 in the July 1, 1951, issue; "Some circuit properties and applications of n-p-n transistors" by R. L. Wallace, Jr. and W. J. Pietenpol, appearing in volume 39 of the Proceedings of the I. R. E., starting at page 753 in the July 1951 issue; and U. S. Patent 2,569,347, issued to W. Shockley on September 25, 1951.

The junction transistor, in general, comprises a body of semiconductive material, such as germanium or silicon, having adjacent regions of opposite conductivity type, with circuit connections to the various regions being made via ohmic, non-rectifying contacts (as contrasted with the use of rectifying contacts in the so-called point contact transistor). Non-linear effects originate within the semiconducting body, the critical "contact" areas apparently being the inter-region "junctions." In the basic forms of the junction transistor, with which this invention is primarily concerned, the semi-conducting body includes three successive zones of alternately opposite conductivity type: i. e. the p-n-p junction transistor, in which two p-type regions are separated by an intermediate n-type region, or the n-p-n junction transistor, in which a p-type region is interposed between two n-type regions.

Experiments conducted by the applicant have revealed that reversals of the direction of current flow in a control circuit connected between the intermediate zone and one of the end zones of a p-n-p or n-p-n junction transistor will effect the "opening" or "closing" of a utilization circuit connected between the two end zones. That is, reversals of the direction of current flow in the control circuit will substantially change the impedance presented by the transistor to a utilization or load circuit connected between the end zones of the transistor from an extremely high impedance to a low impedance or vice versa. It has further been noted by the applicant that when the direction of current flow in the control circuit is such that the utilization circuit is closed, current may flow in either direction through the utilization circuit, the direction of current flow at any instant depending upon the polarity of the effective bias applied between the two end zones at that instant.

These effects have been utilized in the present invention to provide electronic switching arrangements in which application of switching signals to a control circuit connected between the intermediate zone and an end zone of a junction transistor controls the opening or closing of a utilization or load circuit connected between the two end zones of the transistor. A unique capability of these electronic switching arrangements is that the controlled current flowing through the transistor switching device may be either unidirectional or bidirectional as may be appropriate to the requirements of the desired utilization.

In one specific embodiment of the present invention, in which the utilization circuit includes an inductance coil, advantage is taken of this unique capability to provide an electronic switching arrangement which serves as a simple, economical sawtooth current wave generator.

A primary object of the present invention is to provide a simple electronic switching circuit capable of bidirectional current control.

Another object of the present invention is to provide circuit arrangements employing semi-conductor circuit elements as switching devices permissive of bidirectional current flow.

An additional object of the present invention is to provide a switching circuit employing a junction transistor as a bidirectional switch.

A further specific object of the present invention is to provide a simple sawtooth current wave generator employing a junction transistor as a bidirectional switch.

Other and incidental objects of the invention will be apparent to those skilled in the art from a reading of the following specification and an inspection of the accompanying drawing in which:

Fig. 1 is a schematic circuit diagram illustrating in generalized form an embodiment of the present invention in which switch control of current flow through a load is achieved with a junction transistor, Fig. 1*a* is a graph showing the control current-load current relationships for the circuit arrangement of a representative "symmetrical" junction transistor in which a control circuit is connected between the transistor's base and emitter electrodes and a controlled or load circuit is connected between the transistor's emitter and collector electrodes;

Figures 1, 1A, 2, 3, 4:
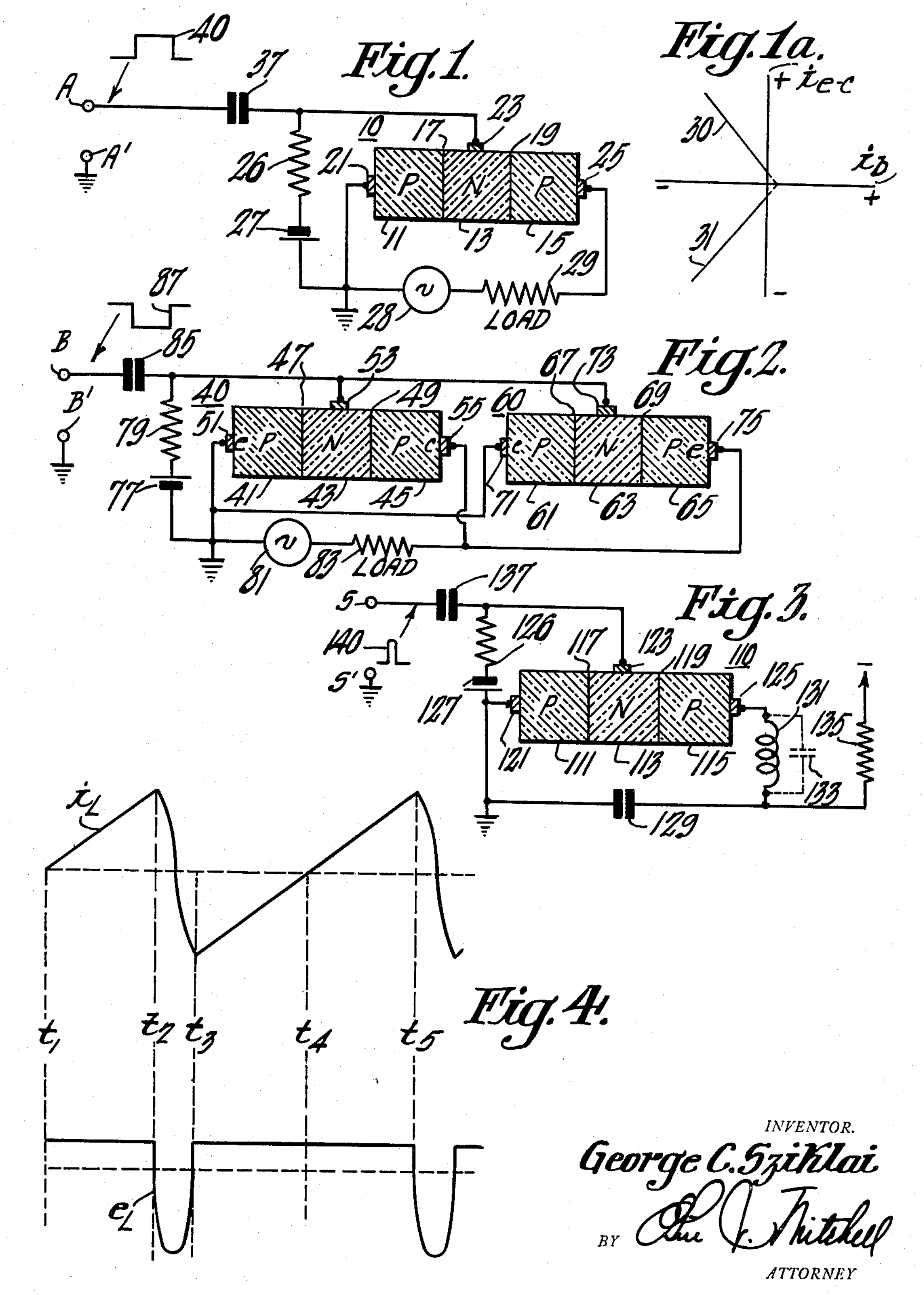
Fig. 2 is a schematic circuit diagram illustrating another embodiment of the present invention employing a pair of junction transistors to effect switch control of current flow through a load.
Fig. 3 is a schematic circuit diagram illustrating an additional specific embodiment of the present invention in which the switching principles of the invention are utilized to provide a flow of current having a sawtooth waveform.
Fig. 4 is a graph illustrating current and voltage waveforms occurring in the circuit of Fig. 3.

Turning first to Fig. 1 for an appreciation of the general principles of the present invention, there is shown a circuit arrangement utilizing a junction transistor 10 to control the alternating current (A. C.) energization of a load, indicated symbolically by load resistor 29.

The junction transistor 10 may be of the p-n-p type as illustrated and thus comprise a body of semi-conducting material, such as germanium, having two p-type regions, 11, and 15, separated by and contiguous with (opposite surfaces of) an n-type region 13. Electrical "barriers," as discussed in the aforementioned Shockley patent, occur at the interfacial junctions 17, 19 between the contacting semi-conducting regions of relatively opposite conductivity type. The electrodes 21, 23, and 25, by which external circuit connections are made to the respective regions 11, 13, and 15, make essentially ohmic or non-rectifying contacts with their respective regions.

In accordance with conventional nomenclature in the transistor field, the electrodes 21, 23, and 25 will be referred to as emitter, base, and collector, respectively. However, it will be appreciated, particularly in view of the bidirectional character of the current flow in the load circuit, that the designation of electrode 21 as emitter and electrode 25 as collector is essentially arbitrary and not intended to be restrictively indicative of their respective functions.

In the arrangement shown in Fig. 1, the emitter 21 is connected directly to ground. The base 23 is connected via a resistor 26 and a bias source, such as battery 27, to the grounded emitter 21, the battery connections being such as to forwardly bias the base 23 with a negative potential relative to the grounded emitter 21. The collector 25 is connected to the grounded emitter via a load 29 and a potential source 28, which may be a D. C. source such as a battery or may be an A. C. source as shown. Switching voltage impulses 40, of a positive polarity relative to the grounded emitter 21 and of sufficient magnitude to change the forward bias on base 23 to a reverse bias, are applied to the base-emitter control circuit from input terminals A, A' via capacitor 37.

In the absence of a positive switching impulse the direction of flow of control circuit current due to the forward bias on base 23 is such that an energizing circuit for load 29 is closed through the emitter-collector path in transistor 10. However, when a positive switching impulse 40 of sufficient magnitude to reverse the direction of current flow in the base-emitter circuit is applied via capacitor 37, the current path between emitter and collector is effectively opened, and energization of the load is interrupted for the duration of the switching impulse.

While control of the energization of a load from an A. C. source has been illustrated in Fig. 1, it will be understood that the arrangement may be readily adapted to effect control of the direct current (D. C.) energization of a load. It may be helpful toward a complete understanding of the invention to explain the conditions that would prevail if the A. C. source 28 were replaced by a D. C. source. Let us assume first that source 28 is replaced by a battery having its negative terminal connected to the grounded emitter. In the absence of positive switching impulses, the direction of conventional current flow in the external load circuit will be from emitter 21 through the battery and load to collector 25. When a positive switching impulse is applied to the base-emitter control circuit to reverse the direction of current flow in the control circuit, the load circuit will be effectively opened and there will be substantially no current flow through the load for the duration of the impulse.

Let us now assume that the connections to the battery replacing source 28 are reversed so that the battery's positive terminal is connected to the grounded emitter. In the absence of positive switching impulses, the direction of conventional current flow in the external load circuit will be from collector 25 through the load and battery to emitter 21. When a positive switching impulse is applied to the base-emitter control circuit to reverse the direction of current flow in the control circuit, the load circuit will be effectively opened and there will be substantially no current flow through the load for the duration of the impulse.

With the above results of the two D. C. bias conditions in the load circuit in mind, the practitioner of the present invention will more readily appreciate the operation of the circuit of Fig. 1 employing the illustrated A. C. "bias" in the load circuit. Thus, during positive half cycles of voltage developed by source 28, one D. C. bias condition is effectively presented to the transistor load circuit, while negative half cycles effectively present the other D. C. bias condition to the transistor load circuit. The result will be that during periods when the direction of control circuit current, due to forward bias between base 23 and emitter 21, is such as to close the load circuit, the load circuit current will be bidirectional permitting A. C. energization of the load.

It should be readily appreciated that it would be desirable in the bidirectional current control arrangement of Fig. 1 to employ a "symmetrical" junction transistor: i. e. a transistor in which the control current-load current characteristic for one direction of flow of load current is essentially symmetrical with the control current-load current characteristic for the opposite direction of flow of load current. Not all junction transistors attain this condition of symmetry; primarily as a consequence of the particular procedure employed in their fabrication or development, some junction transistors present a substantially greater impedance to current flow in one direction between the outer zones, for a given set of bias conditions, than they present to current flow in the opposite direction between the outer zones under equivalent bias conditions.

While there are many contributing factors which may determine the presence or lack of symmetry in the aforementioned characteristics of the junction transistor, it is believed by the applicant that if the resistivities of the two outer zones are substantially equal and if the two junctions are symmetrical (i. e. if the junction between the one outer zone and the intermediate zone is substantially equal in magnitude or extent to the junction between the other outer zone and the intermediate zone), a sufficient degree of symmetry in these current characteristics will be achieved to permit the consideration of the unit as a "symmetrical" junction transistor.

Desirable current characteristics of a "symmetrical" p–n–p junction transistor are illustrated in the graph of Fig. 1A which shows control current-load current relationships for "symmetrical" junction transistor circuit arrangement having a base-emitter input circuit referred to as "control circuit," and an emitter-collector output circuit referred to as "load circuit" as was done in the discussion of Fig. 1. Control current $i_b$ is plotted as the abscissa with positive values indicating conventional current flow into the base and negative values indicating conventional current flow out of the base, and load current $i_{ec}$ is plotted as the ordinate with positive values indicating conventional current flow into the collector and negative values indicating conventional current flow out of the collector. Characteristic 30 shows the effect on load current of variations in control current when the collector is biased with a given positive potential relative to the emitter, while characteristic 31 shows the effect on load current of variations in control current when the collector is biased with an equivalent negative potential relative to the emitter.

It is seen that when control current is flowing out of the base (i. e. when there is forward bias applied in the base-emitter circuit) the load current will vary substantially directly with control current variations, and the current relationships are substantially the same whether the bias between emitter and collector is such as to cause load current flow into the collector or such as to cause load current to flow out of the collector. It is also seen that load current in either direction is insignificant or zero for all values of control current when control current flows into the base (i. e. when there is reverse bias applied in the base-emitter circuit).

It should be pointed out that in many applications of the embodiment illustrated in Fig. 1, as where symmetry of the A. C. energization of the load is not critical or where D. C. energization of the load is the subject of the control, the junction transistor 10 need not display the degree of symmetry illustrated in Fig. 1A, and it may even be desirable to select a strongly "asymmetrical" transistor unit as the switching device. However, where symmetry of bi-directional load current is desired or necessary, an alternative to the use of "symmetrical" junction transistors in the arrangement illustrated in Fig. 1 is the use of the balanced arrangement shown in Fig. 2.

The latter embodiment is of particular interest where junction transistors are to be used in switching control of bidirectional currents. By connecting in reverse parallel relation the emitter-collector paths of two junction transistors 40 and 60, both of the same type and having similar asymmetries in their control current-load current characteristics, a balanced, symmetrical load circuit for bidirectional currents is achieved through using asymmetrical transistor units.

The junction transistor 40 shown in Fig. 2 is of the p-n-p type, having two p-type zones 41, 45 separated by an n-type zone 43, "barriers" between adjacent zones of opposite conductivity type occurring at the inter-zone junctions 47, 49. Emitter, base, and collector electrodes 51, 53 and 55, respectively, make ohmic, non-rectifying contacts with the respective zones 41, 43, and 45.

The emitter 51 is connected directly to ground, while the base 53 is connected via a resistor 79 and a bias source, such as battery 77, to the grounded emitter, the battery connections being such as to bias the base 53 in a reverse direction with a positive potential relative to the grounded emitter 51. The collector 55 is connected via a load, indicated symbolically by load resistor 83, and a potential source 81 to the grounded emitter 51. It will be assumed that the control current-load current characteristics of transistor 40 are asymmetrical (in the sense previously discussed), "favoring" the collector-to-emitter direction for conventional current flow in the emitter-collector path.

The circuit of Fig. 2 also includes a second junction transistor 60, similar in type and asymmetry to the transistor 60, similar in type and asymmetry to the transistor 40. Thus, transistor 60 has two p-type zones 61, 65, separated by an n-type zone 63; inter-zone junctions 67 and 69; and collector, base and emitter electrodes 71, 73, and 75, respectively, making ohmic, non-rectifying contacts with the respective regions 61, 63 and 65. The asymmetry of the control current-load current of transistor 60 will also be assumed to "favor" the collector-to-emitter direction for conventional current flow in the emitter-collector path.

The collector 71 of transistor 60 is connected to the grounded emitter 51 of transistor 40, while the emitter 75 of transistor 60 is connected to the collector 55 of transistor 40. The base 73 of transistor 60 is connected to the base 53 of transistor 40, the base 73 thus being biased in a reverse direction with a positive potential relative to the grounded collector 71. Switching voltage impulses 87 of negative polarity relative to ground, are applied to the base-emitter control circuit of transistor 40 (and thus also to the base-collector control circuit of transistor 60) from input terminals B, B′ via capacitor 85.

In the absence of negative switching impulses, the direction of flow of current in the two base control circuits due to the reverse bias therein is such as to block the flow of current between the outer zones of both transistors, and thus an energizing circuit for load 83 cannot be completed. However when an applied switching impulse 85 overcomes the bias in the two control circuits and reverses the direction of flow of current therein, an energizing circuit is closed through the parallel emitter-collector paths of the two transistors, and A. C. energization of load 83 continues for the duration of the switching impulse. During this period, positive half cycles of the voltage developed by source 81 present load circuit bias in the "favorable" direction to the emitter-collector path of one transistor and in the "unfavorable" direction to the emitter-collector path of the other transistor, while negative half cycles of source 81 voltage present the converse load circuit bias conditions. The result is a symmetrical, undistorted bidirectional current energization of load 83, since the net control current-load current characteristics for the reverse parallel connection of the two emitter-collector paths are symmetrical.

It should also be noted that Fig. 2 shows control circuit bias condition (i. e. reverse bias) suitable for switching arrangements where the controlled or load circuit is to be normally open, while Fig. 1 illustrates a control circuit bias condition (i. e. forward bias) suitable for switching arrangements where the controlled or load circuit is to be normally closed. Thus, if the connections to battery 27 in Fig. 1 should be reversed, a normally open energizing circuit for load 29 would be provided, subject to closing by suitable negative switching impulses. Similarly, if the connections to battery 77 in Fig. 2 should be reversed, a normally closed energizing circuit for load 83 would be provided, subject to opening by suitable positive switching impulses.

Fig. 3 illustrates another embodiment of the present invention in which advantage is taken of the bidirectional switching properties of the junction transistor as revealed in the previous discussions to provide a simple efficient system for generating sawtooth current waveforms. The junction transistor 110 in Fig. 3 may be of the p-n-p type, as shown, thus having an n-type region 113 interposed between two p-type regions 111 and 115, the interregion junctions being designated as 117 and 119. Electrodes 121, 123 and 125, making ohmic, non-rectifying contacts with the respective regions 111, 113 and 115, will be referred to as emitter, base, and collector, respectively.

With emitter 121 grounded, a control circuit including a resistor 126 and a bias source, such as battery 127, is connected between base 123 and the grounded emitter 121. The battery connections are such as to forwardly bias base 123 with a negative potential relative to the grounded emitter. An inductance coil 131, having a net distributed capacitance represented by capacitor 133 (illustrated in dotted lines), is connected in series with a bias source (the charged capacitor 129) between the collector 125 and the grounded emitter 121.

The collector side of capacitor 129 is connected via resistor 135 to a source of negative potential as indicated, or alternatively to a source of positive potential. Periodically recurring voltage pulses 140 of positive polarity relative to ground, from a suitable source connected to the input terminals S, S′, are applied via capacitor 137 to the base-emitter control circuit.

In Fig. 4, the waveform of the current flowing through inductance coil 131 is illustrated as $i_L$ while the waveform of the voltage across the inductance coil 131 is illustrated as $e_L$. The ensuing explanation of the operation of the arrangement of Fig. 3 will be aided by reference to these waveforms illustrated in Fig. 4.

At the start of operation (time $t_1$), the direction of flow of current in the base-emitter control circuit due to the forward bias between base 123 and emitter 121 is such as to close the load circuit through the emitter-collector path. As a result of the polarity of load circuit bias provided by capacitor 129, the flow of inductance-charging current through the emitter-collector path is in the emitter-to-collector direction. Assuming a negligible amount of resistance in the reactive load circuit, the current through the coil $i_L$ will increase linearly with time until time $t_2$, when a pulse 140 is applied to the control circuit to reverse the direction of current therein. The emitter-collector load circuit is thereupon opened, and the energy stored in inductance 131 will then begin to discharge through the distributed capacitance 133 in an oscillatory manner.

With the width of pulse 140 chosen to be equal to half the self-resonance period of the inductance coil 131, the pulse terminates at time $t_3$ after the coil current $i_L$ and its derivative, coil voltage $e_L$, have passed through respective half-cycles of oscillation as shown in Fig. 4. At this time $t_3$ the termination of pulse 140 permits the return to a forward bias condition in the base-emitter control circuit, and thereupon the load circuit is again closed. Conventional current flow through the emitter-collector path is now in the collector-to-emitter direction as the inductance 131 returns its energy to the capacitor 129 with the current linearly decreasing with time, until time $t_4$ when current equilibrium is reached. The operating cycle now repeats as the source 129 delivers a current linearly increasing with time to the inductance 131 until time $t_5$ when another impulse 140 opens the load circuit, etc.

The arrangement of Fig. 3 is thus seen to be a very efficient system for generating sawtooth current waveforms, since the energy from the charged capacitor which is stored in the inductance during one portion of the operating cycle is returned to the capacitor during a later portion of the operating cycle. Theoretically, if there were no resistance in the load circuit, no external energy other than the switching pulses would be required to provide the sawtooth current wave. However, since there necessarily will be some resistance in the load circuit, some energy losses will occur therein, with a slight resultant drain on the source connected to resistor 135 to replace these losses.

As previously noted, the source, to which capacitor 129 is coupled via resistor 135, may alternatively be a source of positive potential relative to ground. However, where a junction transistor of the p-n-p type is utilized as the switching device in a sawtooth generator as exemplified by Figure 3, the use of a negative source as illustrated may generally be preferred with respect to minimizing the amplitude requirements for the applied pulses 140, since it would appear that the alternative use of a source of positive potential of corresponding magnitude would require a greater amplitude switching pulse to insure essentially complete cutoff during the desired periods.

The arrangement of Fig. 3 will find great utility in electromagnetic deflection systems suitable for use with cathode ray tubes. Thus, for example, the arrangement of Fig. 3 might constitute the horizontal deflection system for a television receiver, with pulses 140 being horizontal sync pulses appearing at the output of the television receiver's sync signal separator connected to terminals S, S′, and with inductance 131 being the horizontal deflection yoke of the receiver's kinescope.

It should be pointed out that the control circuit referred to in describing the present invention may be connected between the intermediate zone of the transistor and either of the two outer zones. Thus, for example, if the electrode in contact with one outer zone of a "symmetrical" junction transistor in arbitrarily designated as emitter and the electrode in contact with the other outer zone of the transistor is arbitrarily designated as collector, the choice between connecting the transistor in a switching arrangement with the control circuit connected between base and emitter or between base and collector is essentially arbitrary. Also, when an "asymmetrical" junction transistor is employed in the practice of the present invention, the control circuit may be connected between base and emitter or between base and collector as may be appropriate to the requirements of the particular utilization desired.

It should additionally be pointed out that while junction transistors of the p-n-p type have been illustrated in the accompanying figures, junction transistors of the n-p-n type are equally applicable to the circuits of the present invention. With appropriate reversals of the polarity of the biases and triggering pulses, the same control actions may be achieved with the circuits of the invention with an n-p-n junction transistor substituted as the switching device.

It should also be appreciated that in the practice of the present invention the switching signals and the load, the energization of which is controlled in response to the switching signals, may take any of a variety of forms. Thus the switching signals may be in the form of periodic waves of sinusoidal or non-sinusoidal shapes, may be in the form of a periodic or aperiodic pulse train, or may take other forms, as appropriate to the control action desired. Also, the load may be an ultimate utilization device itself, such as a lamp, a heating device, or a deflection coil, or may only be the input circuit or control element of a preliminary stage of a controlled electronic system, or may be some other form of controlled device, as appropriate to the utilization desired.

I claim:

1. An electronic switching system including a semiconductor device comprising a body of semiconductive material having two zones of one conductivity type and a third zone of the opposite conductivity type between and in contact with said two zones, a control circuit connected between said third zone and one of said two zones, a utilization circuit connected between said two zones, and means for reversing the direction of flow of current in said control circuit to control the opening and closing of said utilization circuit said utilization circuit including means for causing the current flowing in said utilization circuit when closed to alternate in direction.

2. An electronic switching system including a junction transistor comprising a body of semiconductive material having three successive zones of alternately opposite conductivity type, a utilization circuit connected between the outer zones, a control circuit connected between the intermediate zone and one of said outer zones, means for applying switching signals to said control circuit to control the opening and closing of said utilization circuit, and means for causing the direction of current flow in said utilization circuit to reverse in response to said switching signals.

3. An electronic switching system including a symmetrical junction transistor comprising a body of semiconductive material having two zones of one conductivity type and a third zone of the opposite conductivity type between and in contact with said two zones, the resisttivities of said two zones being of relatively the same order of magnitude, a control circuit including a bias source connected between said third zone and one of said two zones, a utilization circuit connected between said two zones including means encouraging the flow of current between said two zones, means for applying switching signals to said control circuit, and means for reversing the direction of current between said two zones in response to the application of switching signals to said control circuit.

4. An electronic switching system for controlling bidirectional currents including a semiconductor device comprising a body of semiconductive material having two zones of one conductivity type and a third zone of the opposite conductivity type between and in contact with said two zones, a control circuit including a bias source connected between said third zone and one of said two zones, a controlled circuit including a source of bidirectional current and a utilization device connected between said two zones, and means for applying switching signals to said controlling circuit.

5. A system for controlling the energization of a load with alternating current which includes a semiconductor device comprising a body of semiconductive material having two outer zones of one conductivity type separated by an intermediate zone of the opposite conductivity type, a control circuit connected between said intermediate zone and one of said outer zones, a utilization circuit including said load connected between said two outer zones, and means for reversing the direction of flow of current in said control circuit in response to a switching impulse, said utilization circuit including means for energizing said load when said control circuit current is in a given direction with a current which alternates in direction of flow between said two outer zones.

6. A system for controlling the energization of a load with alternating current which includes a pair of semiconductor devices each comprising a body of semiconductive material having two outer zones of one conductivity type separated by an intermediate zone of the opposite conductivity type, each of said devices having an emitter electrode in substantially ohmic contact with one of said outer zones, a collector electrode in substantially ohmic contact with the other of said outer zones, and a base electrode in substantially ohmic contact with said intermediate zone, a control circuit connected between the base and emitter electrodes of one of said devices, a utilization circuit including said load connected between the emitter and collector electrodes of said one device, means for connecting the base, emitter, and collector electrodes of the other of said devices respectively to the base, collector, and emitter electrodes of said one device, and means for reversing the direction of flow of current in said control circuit.

7. An electronic switching system for generating sawtooth current waveforms which includes a semiconductor device comprising a body of semiconductive material having two zones of one conductivity type and a third zone of the opposite conductivity type between and in contact with said two zones, a control circuit connected between said third zone and one of said two zones, a load circuit including an inductance and a unidirectional potential source connected between said two zones, a bias source in said control circuit normally producing a flow of current in said control circuit in a given direction, and means for applying periodic impulses to said control circuit to periodically reverse the direction of flow of current in said control circuit.

8. A system for generating sawtooth current waveforms employing a junction transistor having base, collector and emitter electrodes, said system comprising a controlled circuit including, in series, an inductance coil, a unidirectional potential source, and the emitter-collector path of said junction transistor; a control circuit including a source of bias connected between said base electrode and said emitter electrode, said bias source providing said base electrode with a forward bias to cause a flow of current through said control circuit in a direction permitting a flow of current in said controlled circuit through said emitter-collector path; and means for applying periodic switching impulses to said control circuit to overcome said forward bias and reverse the direction of flow of current through said control circuit whereby said emitter-collector path is opened and the flow of current through said emitter-collector path is interrupted for the duration of each impulse.

9. A system in accordance with claim 8 in which the duration of each switching impulse is substantially equal in time to half the self-resonance period of said coil.

10. Apparatus comprising the combination of a semiconductor device having a current path of controllable conductivity, a load, an energy source, means for rendering said current path alternately conducting and non-conducting, and means for utilizing said current path as a bidirectional switch coupling said load to said energy source when rendered conducting and decoupling said load and said energy source when rendered non-conducting.

11. Apparatus comprising the combination of a semiconductor device having a current path of controllable conductivity, means coupled to said semiconductor device for controlling the alternation between a conducting and a non-conducting condition for said current path, and a load circuit including said current path such that the current flow in said current path when conducting is alternately in opposite directions.

12. Apparatus comprising the combination of a semiconductor device having a bidirectional current path of controllable conductivity, a load circuit including said current path, and means coupled to said semiconductor device for controllably rendering said current path non-conducting and bidirectionally conducting, respectively.

13. Apparatus comprising the combination of a semiconductor device comprising a body of semiconductive material having an input electrode, an output electrode, and a common electrode, a load circuit coupled between said output electrode and said common electrode, a control circuit coupled between said input electrode and said common electrode, means coupled to said control circuit for controlling the opening and closing of said load circuit, said load circuit being further characterized in that load current successively flows in respectively opposite directions between said output electrode and said common electrode.

14. Apparatus comprising the combination of a semiconductor device having a plurality of electrodes, a load circuit coupled between a pair of substantially similar ones of said plurality of electrodes, means coupled between a third of said plurality of electrodes and one of said pair of electrodes for controlling the opening and closing of said load circuit, said load circuit including means for causing current flow in alternately opposite directions between said pair of electrodes.

15. Apparatus comprising the combination of a semiconductor device including a body of semiconductive material having two zones of one conductivity type and a third zone of the opposite conductivity type between and a contact with said two zones, the current path in said semiconductor device between said two zones being of controllable conductivity, means including a control circuit coupled between said third zone and one of said two zones for alternately rendering said current path conducting and non-conducting, and a load circuit coupled between said two zones to include said current path, the load current flowing through said current path periodically reversing in direction.

16. Apparatus comprising the combination of a transistor having base, emitter and collector electrodes, means for establishing a bias in a given direction between said base and emitter electrodes, means for reversing the direction of said bias in response to a switching impulse, a load circuit including the emitter-collector path of said transistor, said load circuit being open when said bias is in one of said directions, said load circuit being closed when said bias is in the other of said directions, said load circuit including means for periodically reversing the direction of the current flowing in said load circuit.

17. Apparatus comprising the combination of a junction transistor having base, emitter and collector electrodes, means coupled to said base for switching the emitter-collector path of said transistor between a conducting and a non-conducting condition, a load, an energy source, a current path between said load and said source, and means for utilizing said emitter-collector path as a bidirectional current supporting circuit element closing said current path when in a conducting condition and opening said path when in a non-conducting condition.

18. Apparatus comprising the combination of a junction transistor, a load circuit including a load and an energy source, means for rendering a current path in said transistor alternately conducting and non-conducting, and means for utilizing said current path as a bidirectionally conducting switch closing said load circuit when in a conducting condition.

19. Apparatus comprising the combination of a semiconductor device including a body of semiconductive material having two zones of one conductivity type and a third zone of the opposite conductivity type between and in contact with said two zones, a utilization circuit connected between said two zones, a control circuit connected between said third zone and one of said two zones, and means for applying a switching impulse to said control circuit, said utilization circuit including means responsive to the application of said switching impulse for reversing the direction of current flow in said load circuit.

20. A sawtooth wave generator comprising apparatus in accordance with claim 19 wherein said control circuit includes means for normally rendering said utilization circuit closed, wherein said switching impulse applying means is adapted to periodically open said utilization circuit for a predetermined interval, and wherein said switching impulse application responsive means comprises an inductance in said utilization circuit.

21. A sawtooth wave generator in accordance with claim 20 wherein said inductance is shunted by a capacity, the duration of said predetermined time interval being substantially equal to half the parallel resonance period of said inductance and shunt capacity.

22. A sawtooth wave generator comprising apparatus in accordance with claim 11 wherein said load comprises an inductance having a predetermined shunt capacity, and wherein said rendering means is such that the rendering of said current path non-conducting occurs periodically and endures for a time interval substantially corresponding to half the parallel resonance period of said coil and shunt capacity.

23. A sawtooth wave generator comprising a combination in accordance with claim 18 wherein said load comprises an inductance.

24. An electronic switching system including a semiconductor device comprising a body of semiconductive material having two zones of one conductivity type and a third zone of the opposite conductivity type between and in contact with said two zones, a utilization circuit connected between said two zones, a control circuit including a source of bias connected between said third zone and one of said two zones, means for applying a switching impulse to said control circuit, the polarity and amplitude of said impulse being such as to overcome the bias and reverse the direction of current flow in said control circuit whereby the impedance presented by said body of semiconductive material to said utilization circuit is substantially altered from a first order of magnitude to a second order of magnitude, one of said orders of impedance magnitude being such as to be substantially prohibitive of current in said utilization circuit and the other of said orders of impedance magnitude being such as to be substantially permissive of current in said utilization circuit, and means for alternating the current in said utilization circuit when the impedance presented thereto by said body of semiconductive material is of said current permissive order of magnitude.

References Cited in the file of this patent

UNITED STATES PATENTS

| | | |
|---|---|---|
| 2,486,776 | Barney | Nov. 1, 1949 |
| 2,533,011 | Eberhard | Dec. 5, 1950 |
| 2,569,347 | Shockley | Sept. 25, 1951 |
| 2,570,939 | Goodrich | Oct. 9, 1951 |

OTHER REFERENCES

Article: "Some novel . . . amplifier," by Webster et al., RCA Review, vol. 10, No. 1, March 1949, pages 5 to 16.